United States Patent [19]

Rickerby et al.

[11] Patent Number: 5,013,419
[45] Date of Patent: May 7, 1991

[54] COATING APPARATUS

[75] Inventors: David S. Rickerby, Jesmond; Derek S. Whitmell, Blewbury; Joseph P. Coad, Uffington; Richard S. Nelson, Goring-on-Thames, all of England

[73] Assignee: United Kingdom Atomic Energy Authority, London, England

[21] Appl. No.: 863,580

[22] Filed: May 15, 1986

[30] Foreign Application Priority Data

May 16, 1985 [GB] United Kingdom ............... 8512455

[51] Int. Cl.$^5$ ............................................. C23C 14/22
[52] U.S. Cl. ........................ 204/298.05; 204/192.31
[58] Field of Search .............. 204/298, 192.12, 192.31, 204/192.38, 164, 298.05

[56] References Cited

U.S. PATENT DOCUMENTS

| | | | |
|---|---|---|---|
| 3,926,147 | 12/1975 | Steube | 204/298 X |
| 3,979,273 | 9/1976 | Panzera et al. | 204/298 X |
| 4,026,787 | 5/1977 | Kuehnle | 204/298 |
| 4,151,064 | 4/1979 | Kuehnle | 204/298 |
| 4,252,626 | 2/1981 | Wright et al. | 204/298 X |
| 4,401,546 | 8/1983 | Nakamura et al. | 204/298 |
| 4,411,763 | 10/1983 | Itaba et al. | 204/192 R |
| 4,478,703 | 10/1984 | Edamura et al. | 204/298 |

Primary Examiner—Nam X. Nguyen
Attorney, Agent, or Firm—William R. Hinds

[57] ABSTRACT

An apparatus for coating by sputter ion plating comprises a chamber having a gas inlet and outlet for passing gas under low pressure continuously therethrough; a cathode fabricated of coating material or precursor therefor positioned in the chamber; and means for generating a glow discharge within the chamber to sputter cathode material to form a coating thereof or of a product obtained therefrom on a substrate also positioned in the chamber.

The cathode includes a plurality of projections (e.g. fins) extending from a surface, their disposition and geometry being such as to increase the effective ion current density in the chamber. In this way, high currents at low voltages and pressures may be achieved so that the apparatus can be used to coat a large substrate load, possibly at a higher coating rate.

6 Claims, 1 Drawing Sheet

COATING APPARATUS

This invention relates to an apparatus for carrying out sputter ion plating having a modified cathode.

Sputter ion plating is a known coating technique for producing coatings of uniform thickness, high integrity and good bond strength. It basically comprises the transfer of material from a cathode to a substrate in the presence of a glow discharge (e.g. a DC glow discharge) in a soft vacuum chamber, the material being generated from the cathode by the action of ion bombardment, i.e. sputtering, and ultimately diffusing to the substrate to form a coating thereon. If desired, sputter ion plating may be carried out in a reactive environment so that the material generated from the cathode reacts with a reactive constituent thereof to form a coating that is chemically different from the cathode material. The latter procedure is known as 'reactive sputtering'. Sputter ion plating is described in detail in a number of references in the art, for example in "Wire Industry", 44. December 1977, pages 771 to 777; Welding Institute Reprint, Advances in Surface Coating Technology-International Conference, London 13-15 February 1978, pages 53-59; and Proceedings of 'IPAT' Conference, Edinburgh (June 1977) ps. 177-186.

Examples of coating materials that have been applied by sputter ion plating are aluminium, copper, nickel, titanium, niobium, molybdenum, stainless steel, aluminium bearing ferritic steel, CoCrAlY, titanium carbide, chromium carbide, tungsten carbide and a mixed Ti/Ta carbide. In addition, aluminium oxide, titanium dioxide, aluminium nitride and titanium nitride have been applied by reactive sputtering of the appropriate metal in the presence of oxygen or nitrogen as reactive constituent as appropriate. Tungsten carbide can be applied by co-sputtering tungsten and graphite, or by reactive sputtering of tungsten, e.g. in a hydrocarbon atmosphere.

The invention is concerned with modifications to the geometry of the cathode used in sputter ion plating apparatus thereby to effect one or more process improvements in use of the apparatus. Thus, the invention provides an apparatus for applying a coating of a first material to a second material by sputter ion plating comprising a chamber (preferably having a heater) having a gas inlet and outlet for passing gas under low pressure continuously therethrough; a cathode fabricated of the first material or of a precursor therefor and positioned in the chamber; and means for generating a glow discharge within the chamber to transfer the first material by sputtering from the cathode to form a coating thereof or of a product obtained therefrom on a substrate fabricated of the second material and also positioned in the chamber, the substrate optionally having means for applying a bias potential thereto, wherein the cathode includes a plurality of projections extending from a surface and being so disposed and of such geometry that in operation of the apparatus, the effective ion current density adjacent the cathode is greater than in their absence.

Adjacent projections and the surface define one or more hollow spaces so that the modified cathode behaves like a hollow cathode to give high currents at low voltages and pressures. It is possible that, in operation, electrons are trapped between the projections to cause more ionization than if the projections were not present. This means that the apparatus is less sensitive to substrate load, i.e. the apparatus is better able to coat a large load of components constituting the substrate. Also, the presence of the projections is believed to reduce the heat loading on the substrate so that higher discharge power can be used without the substrate temperature exceeding a given temperature. It is believed that this effect is caused by a reduction in the bombardment of the substrate by fast electrons. Moreover, it is found that, in operation, the edges of the projections are hotter than the remainder of the cathode. Thus, when $N_2$ is used in a reactive sputtering process, it is less likely to poison the cathode and the rate of coating may therefore be increased. Further, it is probable that the sputtering at the ends of the projections is enhanced due to increased ion current density at the small radius of curvature thereby increasing the erosion rate. Increased erosion rate helps to keep the ends of the projections clean. In the case of coating with TiN by reactive sputtering, other areas of the cathode or the walls of the chamber become coated with TiN which has a lower sputtering rate and, where the walls are cathodic, this prevents the wall material from contaminating the coating.

The projections may conveniently be in the form of fins, for example of rectangular shape, mounted substantially normally on a flat cathode surface. The aspect ratio (i.e. the ratio of fin length to spacing of fins) of such a plurality of fins appears to be significant and may for example be about 2:1. Generally, increasing fin density appears to increase coating rate in operation of the apparatus.

By "precursor" is meant a cathode material that, when generated therefrom, reacts with a reactive gas or vapour in the chamber to form a coating on the substrate chemically different from the cathode material as in reactive sputtering.

The first material may, for example, be in the form of one element or, where co-sputtering is to be carried out, in the form of two or more elements when the projections may be made of a different element from the surface.

The invention will now be particularly described by way of example only with reference to the accompanying drawings wherein.

Figure 1:
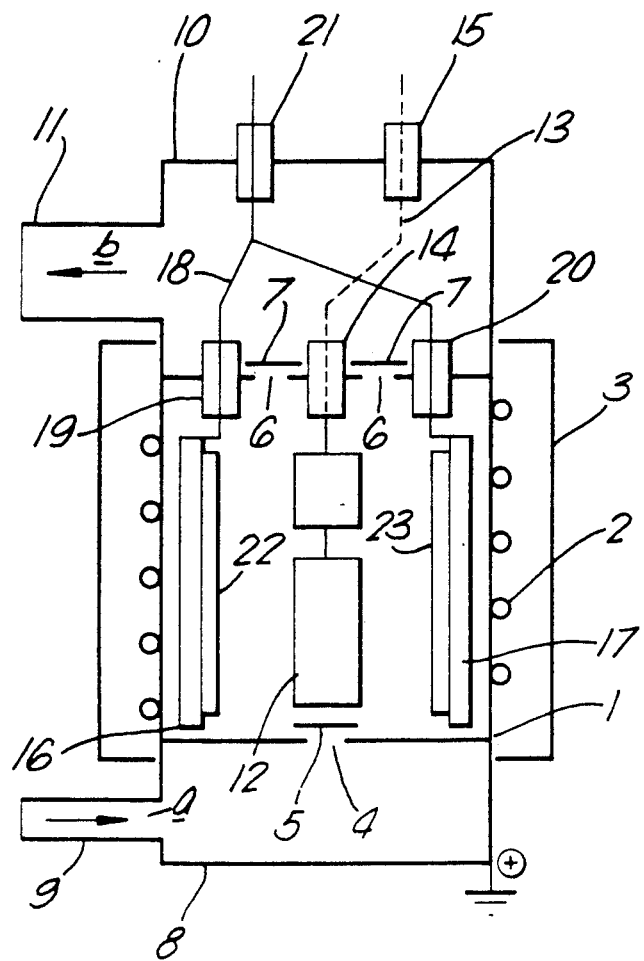
FIG. 1 is a schematic diagram of an apparatus for carrying out sputter ion plating.

Referring to FIG. 1, an earthed cylindrical coating chamber 1 is provided with an externally mounted resistance heater 2 having a cooling jacket 3. The coating chamber 1 has a gas inlet vent 4 with an associated baffle 5 and gas outlet vents 6 with associated baffles 7. The inlet vent 4 communicates with a getter chamber 8 provided with an inlet conduit 9 and the outlet vents 6 communicate with a pumping chamber 10 provided with a pumping port 11.

A substrate 12 is mounted in the coating chamber 1 and is electrically connected to a bias potential power supply (not shown) by a conductor 13 mounted in insulators 14 and 15 positioned in the walls of the pumping chamber 10. A cathode in the form of a series of target plates of which two 16 and 17 are shown is also mounted within the coating chamber 1. The cathode (e.g. 16 and 17) is electrically connected to a cathode power supply (not shown) by a conductor 18 mounted in insulators 19, 20 and 21 positioned in the walls of the pumping chamber 10. Each target plate (e.g. 16 and 17) has rectangular fins 22 and 23 mounted normally thereon, e.g. by means of spot welding. This is shown in more detail for target plate 16 in FIG. 2.

Figure 2:
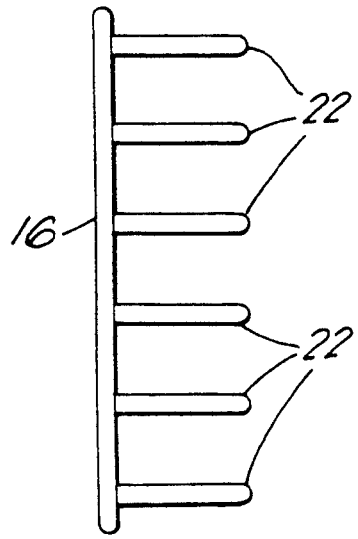
FIG. 2 is a plan view of one form of a modified cathode for use in the apparatus of FIG. 1.

In operation of the apparatus shown in FIGS. 1 and 2, an operating gas is supplied at the inlet conduit 9 and, by operation of a pump (not shown) at the pumping port 11, is drawn into the getter chamber 8 as shown by arrow a and thence into the coating chamber 1 via inlet vent 4. The coating chamber 1 is heated by means of the heater 2 in order to outgas the substrate 12, cathode (e.g. 16 & 17) and evaporate any organic material. Undesired gas and vapour leave the coating chamber 1 via the outlet vents 6 to enter the pumping chamber 10 and are removed via the pumping port 11 as shown by arrow b. A high negative voltage is applied to the target plates (e.g. 16 and 17) by means of the cathode power supply (not shown) to produce a glow discharge with net transfer of cathode material therefrom by sputtering onto the substrate 12 to provide a coating thereon. External heating is not required at this stage since the process generates sufficient power to maintain the operating temperature. If desired, a negative bias may be applied to the substrate 12 during coating by means of the bias potential power supply (not shown). This is to densify the coating by resputtering of deposited material and ion polishing.

Figure 3:
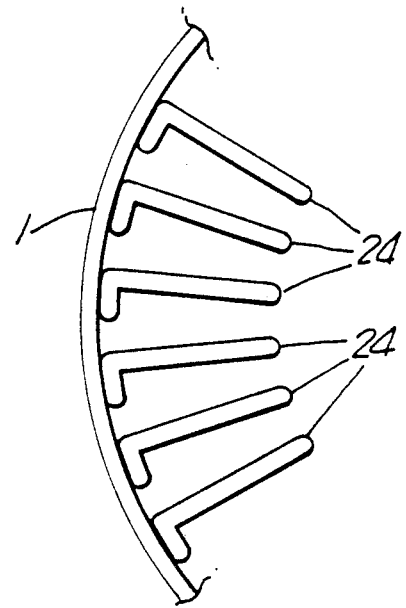
FIG. 3 is a plan view of another form of modified cathode for use in the apparatus of FIG. 1.

Referring to FIG. 3, an alternative form of cathode for use in the apparatus of FIG. 1 is shown. Instead of the flat plates (e.g. 13 and 14) having fins 22 and 23 mounted thereon, a plurality of L-shaped fins 24 is mounted on the inside wall of the coating chamber 1 by means of the shorter limb of the L.

In an alternative arrangement of sputter ion plating apparatus, the polarity of the apparatus shown in FIG. 1 is reversed wherein a positive potential is applied to an anode so that the cathode is the earthed wall of the coating chamber 1. The target of material to be sputtered may comprise material lining the inside wall of the coating chamber 1 (e.g. in the form of sheet) and carrying fins such as shown in FIG. 2. Alternatively, the target could comprise fins such as shown in FIG. 3 attached or placed directly on the wall of the coating chamber 1.

EXAMPLES

Also included below are comparative examples which are not examples of the invention.

General Procedure

The apparatus shown in FIG. 1 was used where the separation of one fin 22 from the next adjacent fin 22 was 10–20 mm. The coating chamber 1 was pumped down to 10–100 m torr pressure with a flowing high purity argon atmosphere purified by passing over freshly deposited titanium. The coating chamber 1 was heated to a temperature of around 300° C. to effect outgassing of the substrate 12 and the cathode e.g. 16 and 17 and evaporation of any organic material. A high negative voltage (400 V to 1000 V) was then applied to the cathode e.g. 16 and 17 to produce a glow discharge with net transfer of material therefrom to the substrate 12 to effect coating thereof. If desired, a negative bias of 20 to 150 V was applied to the coated substrate 12 to densify the coating. Where reactive sputtering was required, a reactive gas was admitted to the coating chamber 1 at a small partial pressure (1 to 100 m torr) during the coating process.

The general procedure described above was used to coat substrates with Ti and, in separate examples, with TiN where the coating was carried out using reactive sputtering with $N_2$ as the reactive gas. The examples were carried out (A) using flat titanium plate cathodes and a substrate comprising flat steel discs (these were comparative examples), (B) using a cathode comprising flat titanium plate have six thin strips of titanium as fins spot-welded thereon with an aspect ratio of 2:1 and a substrate comprising flat steel discs, and (C) using a cathode as shown in FIG. 3 and a substrate in the form of a nickel cylinder (9.5 cm diameter) to simulate a large load.

The results of the examples are shown in the table below:

| EXAMPLE | DISCHARGE CONDITIONS | | | COATING RATE (m/hour) | | CHAMBER PRESSURE (mbar) |
|---|---|---|---|---|---|---|
| | Volt. (V) | Current (Amps) | Power Level (kW) | Ti | TiN | |
| A (comparative) | 660 | 1.4 | 1.4 | | 0.2 | 0.11 |
| A (comparative) | 660 | 1.4 | 1.4 | | 0.06 | 0.2 |
| B (finned plate) | 220 | 6.5 | 2.3 | >1 | 0.3 | 0.12 |
| C (fins on wall) | 200 | 5.6 | 2.0 | 0.4 | 0.1 | 0.2 |
| C (fins on wall) | 253 | 5.0 | 1.9 | 1.5 | 0.3 | 0.11 |
| C (fins on wall) | 316 | 3.8 | 1.9 | 2.0 | 0.55 | 0.065 |

The results show that a much larger current can be obtained at a lower voltage by means of the apparatus of the invention and that coating rates can be significantly increased.

We claim:

1. An apparatus for applying a coating of a first material to a second material by sputter ion plating comprising a chamber having a gas inlet and outlet for passing gas under low pressure continuously therethrough; a cathode, positioned in the chamber, and fabricated of the first material or of a precursor therefor; and means for generating a glow discharge within the chamber to transfer the first material by sputtering from the cathode to form a coating thereof or of a product obtained therefrom on a substrate fabricated of the second material and also positioned in the chamber, wherein the cathode includes a plurality of projections extending from a surface and being so disposed and of such geometry that, in operation of the apparatus, the effective ion current density adjacent the cathode is greater than in their absence, wherein the cathode surface is flat and the projections comprise rectangular fins mounts substantially normally on the surface, and wherein the aspect ratio of the fins is about 2:1.

2. An apparatus for applying a coating of a first material to a second material by sputter ion plating comprising a chamber having a gas inlet and outlet for passing gas under low pressure continuously therethrough; a cathode, positioned in the chamber, and fabricated of the first material or of a precursor therefor; and means for generating a glow discharge within the chamber to transfer the first material by sputtering from the cathode to form a coating thereof or of a product obtained therefrom on a substrate fabricated of the second material and also positioned in the chamber, said cathode including a plurality of projections comprising adjacent fins extending from a surface and being so disposed and of such geometry that, in operation of the apparatus, the effective ion current density adjacent the cathode is greater than in their absence, the gaps between adjacent fins being at least about 10 mm or greater.

3. An apparatus according to claim 2 wherein the cathode surface is flat and the fins are rectangular fins mounted substantially normally on the surface.

4. An apparatus according to claim 2 wherein the aspect ratio of the fins is about 2:1.

5. An apparatus according to claim 2 wherein the cathode comprises the wall of said chamber and the fins are mounted on the internal surface thereof.

6. An apparatus according to claim 5 wherein the internal surface of the chamber carries a lining of the first material or a precursor therefor.

* * * * *